United States Patent
Martwick

(10) Patent No.: US 6,493,807 B1
(45) Date of Patent: Dec. 10, 2002

(54) UPDATING FLASH BLOCKS

(75) Inventor: Andrew W. Martwick, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/346,240

(22) Filed: Jul. 1, 1999

(51) Int. Cl.$^7$ ............................................... G06F 12/00
(52) U.S. Cl. ........................ 711/163; 711/103; 711/156
(58) Field of Search ................................ 711/103, 156, 711/106, 144, 145, 152, 155, 163

(56) References Cited

U.S. PATENT DOCUMENTS

| | | | | | |
|---|---|---|---|---|---|
| 5,142,676 A | * | 8/1992 | Fried et al. | ................. | 711/108 |
| 5,353,410 A | * | 10/1994 | Macon et al. | ................. | 710/52 |
| 5,655,135 A | * | 8/1997 | Sholander et al. | .......... | 345/559 |
| 5,966,733 A | * | 10/1999 | Brewer | ....................... | 711/170 |
| 6,073,206 A | * | 6/2000 | Piwonka et al. | ............ | 711/102 |
| 6,088,759 A | * | 7/2000 | Hasbun et al. | .............. | 707/206 |
| 6,289,410 B1 | * | 9/2001 | Cummins | ................... | 710/200 |
| 2001/0011318 A1 | * | 8/2001 | Dalvi et al. | ................. | 711/103 |

* cited by examiner

*Primary Examiner*—Matthew Kim
*Assistant Examiner*—Matthew D. Anderson
(74) *Attorney, Agent, or Firm*—Blakely, Sokoloff, Taylor & Zamfan LLP

(57) ABSTRACT

The present invention is a system and method for updating memory. The contents of a first storage location in a plurality of storage locations are first copied to a second storage location in the plurality of storage locations. A signal indicating that a read operation accessing the first storage location is non-operational, is issued. The contents of the first storage location are erased. A signal indicating that a read operation accessing the first storage location is operational, is then issued.

15 Claims, 6 Drawing Sheets

UPDATING FLASH BLOCKS

BACKGROUND OF THE INVENTION

1. Field of the Invention

The present invention relates generally to flash, and more particularly, to a system and method for updating flash memories without loss of data.

2. Description of the Related Art

Flash memory devices are typically used for applications requiring non-volatility and in-circuit programmability. Typically, flash memory devices contain separately erasable flash blocks; namely, each flash block can be erased independently of other flash blocks. To update a particular block, it is first erased, and data is then written to the erased block. However, such an updating scheme is susceptible to loss of data if the updating process occurs during a power failure.

As shown in FIG. 1, in conventional flash memory architectures, a flash memory device 10 is typically partitioned into a number of separate flash blocks which can be individually erased. In this flash architecture, there are 16 flash blocks, each flash block $20_1$–$20_{16}$ having 64 kilobytes ("KB") of memory. Every bit of the flash blocks $20_1$–$20_{16}$ is placed in an initial ("SET") state. The flash memory device is written by changing the state of a bit from its SET state to a desired state. The desired state may be the SET state or an opposite ("CLEAR") state. Typically, bits can only be changed from SET to CLEAR, or remain in the same state. Once a bit is changed from SET to CLEAR, it cannot be changed back to SET unless it is erased. Moreover, the erasure cannot be done for individual bits, rather it is done for the entire flash block 20y (y=1,2, . . . or 16) which contains that bit.

In such conventional flash memory architectures, a block, such as block 16, is updated by first erasing the entire block and then performing a write to the block. However, since flash memories are susceptible to data loss during power failure, the top block, e.g., block 16, which is typically used as a boot block, cannot be updated.

Accordingly, there is a need in the technology for an apparatus and method for overcoming the aforementioned problem. In particular, there is a need for an apparatus and method for updating a block in flash memory so as to overcome the aforementioned problem.

BRIEF SUMMARY OF THE INVENTION

The present invention is a system and method for updating memory. The contents of a first storage location in a plurality of storage locations are first copied to a second storage location in the plurality of storage locations. A signal indicating that a read operation accessing the first storage location is non-operational, is issued. The contents of the first storage location are erased. A signal indicating that a read operation accessing the first storage location is operational, is then issued.

DETAILED DESCRIPTION OF THE PREFERRED INVENTION

Figure 1:
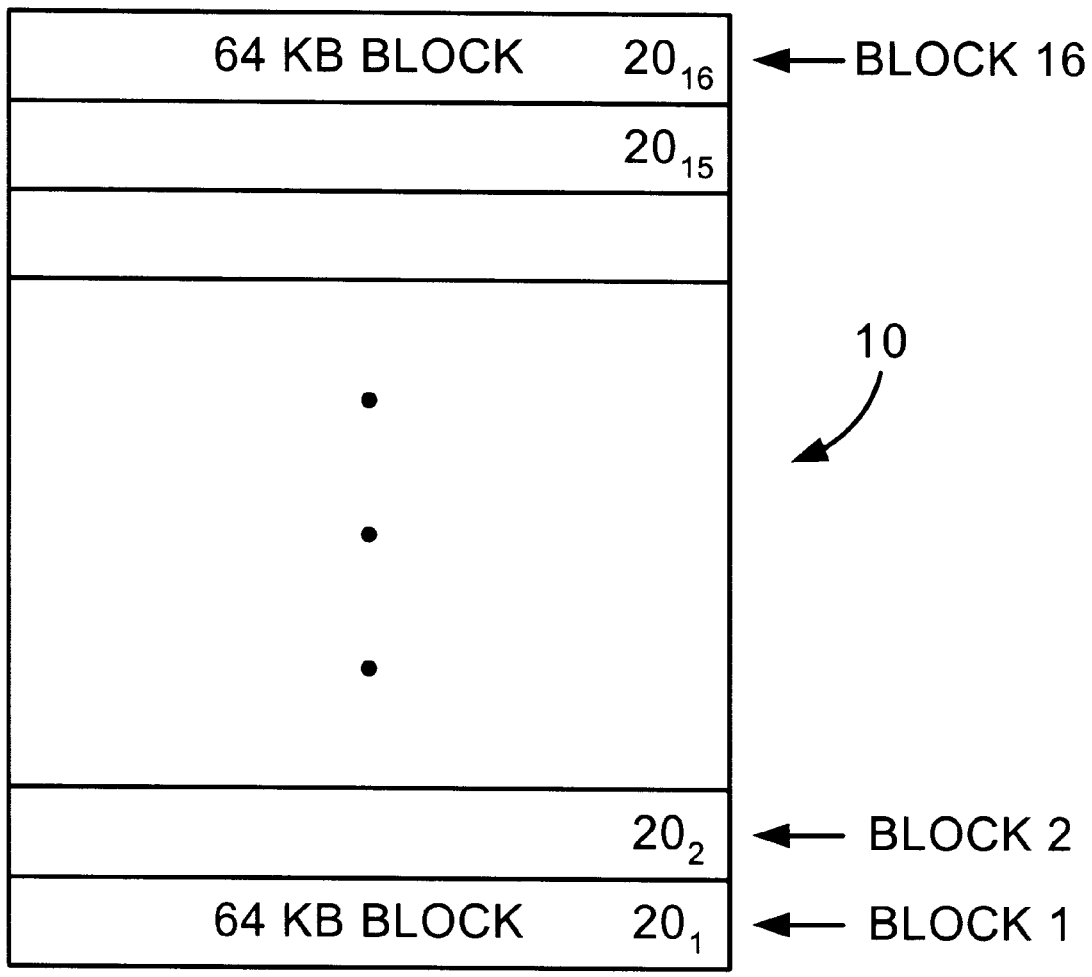
FIG. 1 is a diagram of a conventional memory map of flash memory architecture.
Figure 2:
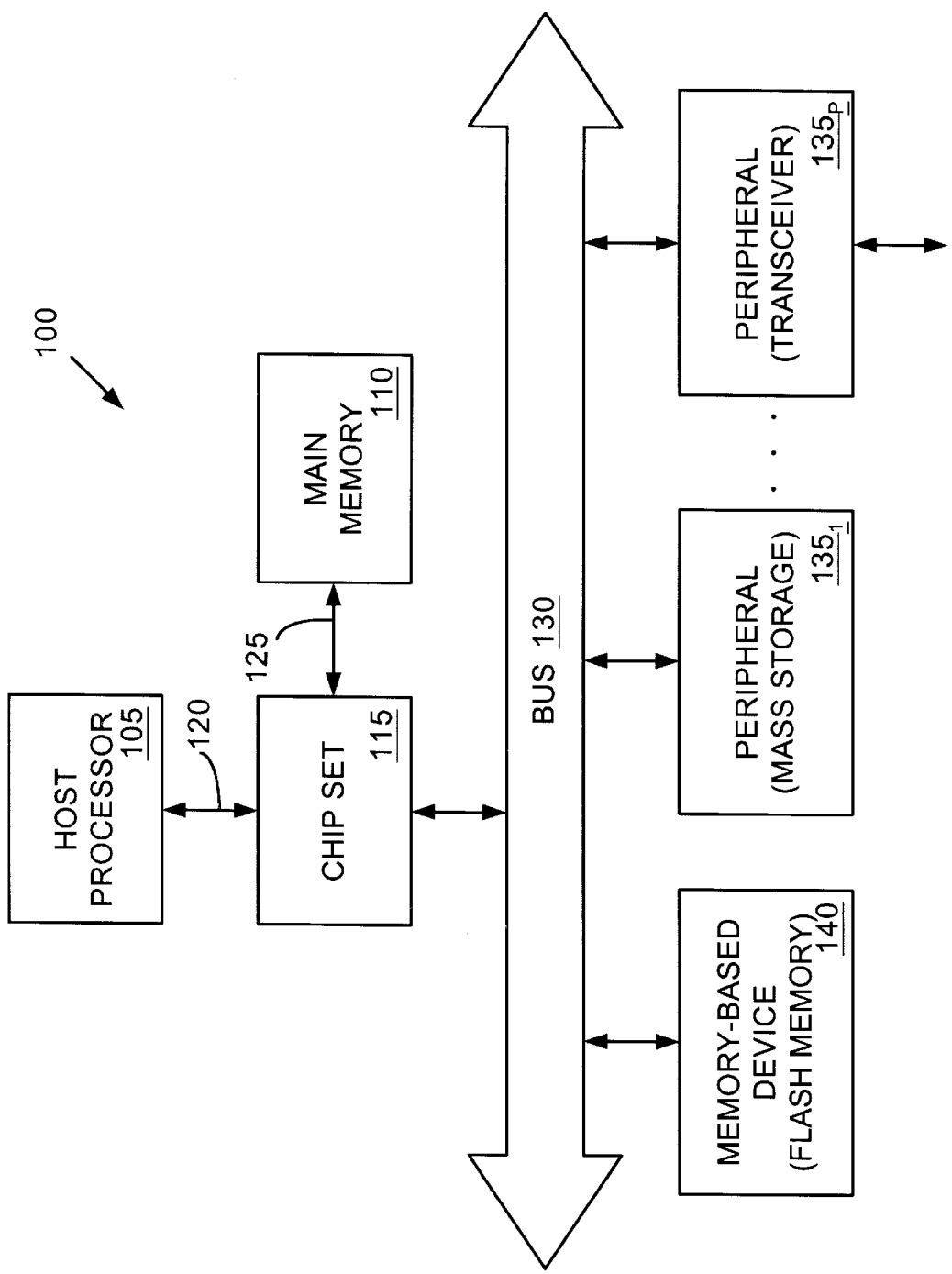
FIG. 2 is a system block diagram of an exemplary processor system in which the apparatus and method of the present invention is used.

The present embodiment is described in reference to a processor system 100. As discussed herein, the processor system may be implemented as a computer, a hard copy device (e.g., a printer, plotter, facsimile machine, etc.), digital cash machine, ATM machine, and the like. In the present embodiment, the processor system 100 comprises a host processor 105 and a main memory module 110 (e.g., a dynamic random access memory "DRAM", a static random access memory "SRAM", etc.) coupled together by a chipset 115. The chipset 115 operates as an interface between a plurality of buses, namely a host bus 120, a memory bus 125 and bus 130.

The bus 130 provides a communication path between the host processor 105 or main memory 110 and a plurality of peripheral devices $135_1$–$135_p$ ("p" being a positive whole number). The bus 130 may include a Peripheral Component Interconnect ("PCI") bus, an Industry Standard Architecture ("ISA") bus or any other type of bus architecture. It is contemplated that bus 130 is shown as a single bus (e.g., a PCI bus), but is may implemented as multiple buses coupled together through bridge circuitry in which each peripheral device $135_1$–$135_p$ is coupled to at least one of the multiple buses. Additionally, peripheral devices $135_1$–$135_p$ may include, but are not limited to, a mass storage device $135_1$ (e.g., a hard disk drive, a CD ROM player, a CD recordable player, a digital tape drive, a floppy disk drive, a digital video disk player, etc.), a transceiver device $135_p$ (e.g., a network interface circuit card, a modem card, etc.) and the like.

A flash memory device 140 may also be coupled to the bus 130. The flash memory device 140 is an integrated circuit ("IC") device including flash memory featuring the flash block update technology of the present invention or a flash memory device as a separate component. In either instance, as discussed below, the flash memory device 140 would require well-known hardware (e.g., a processor, a state machine, a controller, discrete logic circuitry, etc.), and perhaps support software, to control the updating of the flash blocks as well as the manipulation of date between blocks, in accordance with the present invention. The well-known hardware and perhaps support software, are also used to control the setting of a bit representing the operation of the top block of the flash memory device 140, as discussed in detail in the following sections.

Figure 3:
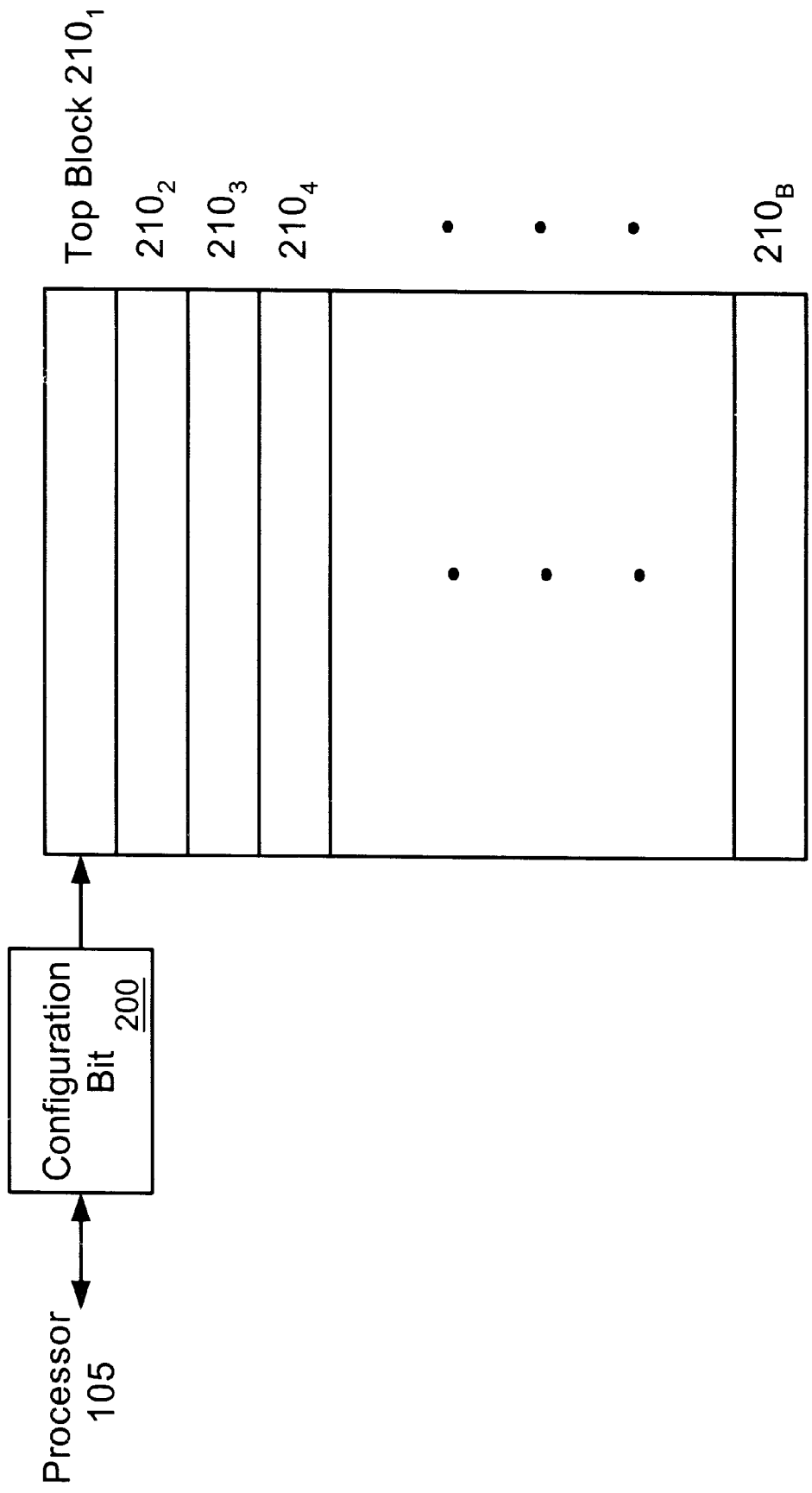
FIG. 3 is an illustrative block diagram showing the memory map of the present invention.

FIG. 3 illustrates one embodiment of the architecture of the flash memory implemented within the flash memory device of the present invention. The flash memory device 140 comprises a configuration element 200, a plurality of flash storage blocks $210_1$–$210_B$ ("B" being a positive whole number where B>1) used for data storage. In one embodiment, the block $210_1$ is a top block of the flash memory device 140, the following block $210_2$ is a block following the top block, block $210_3$ is a parameter block, and blocks $210_4$–$210_B$ are miscellaneous storage blocks such as monolithic BIOS image blocks. The configurable element 200 is coupled to the processor 105, and is used to control operation of the top block $210_2$, and is described in detail below.

Figure 4A:
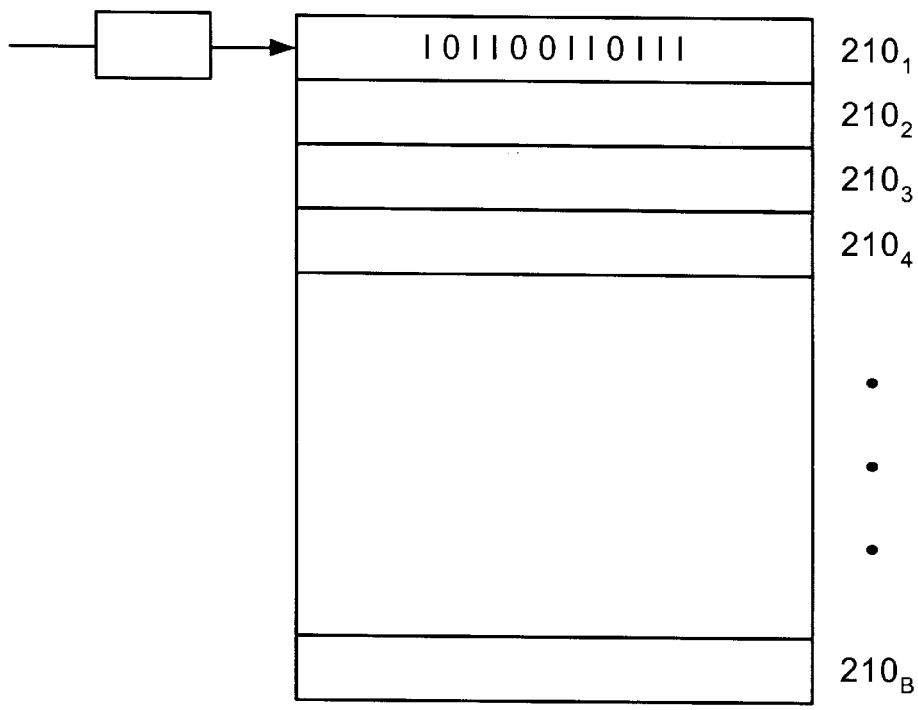
FIGS. 4A–4C are illustrative block diagrams showing the operation of one embodiment of the process of the invention.
Figure 4B:
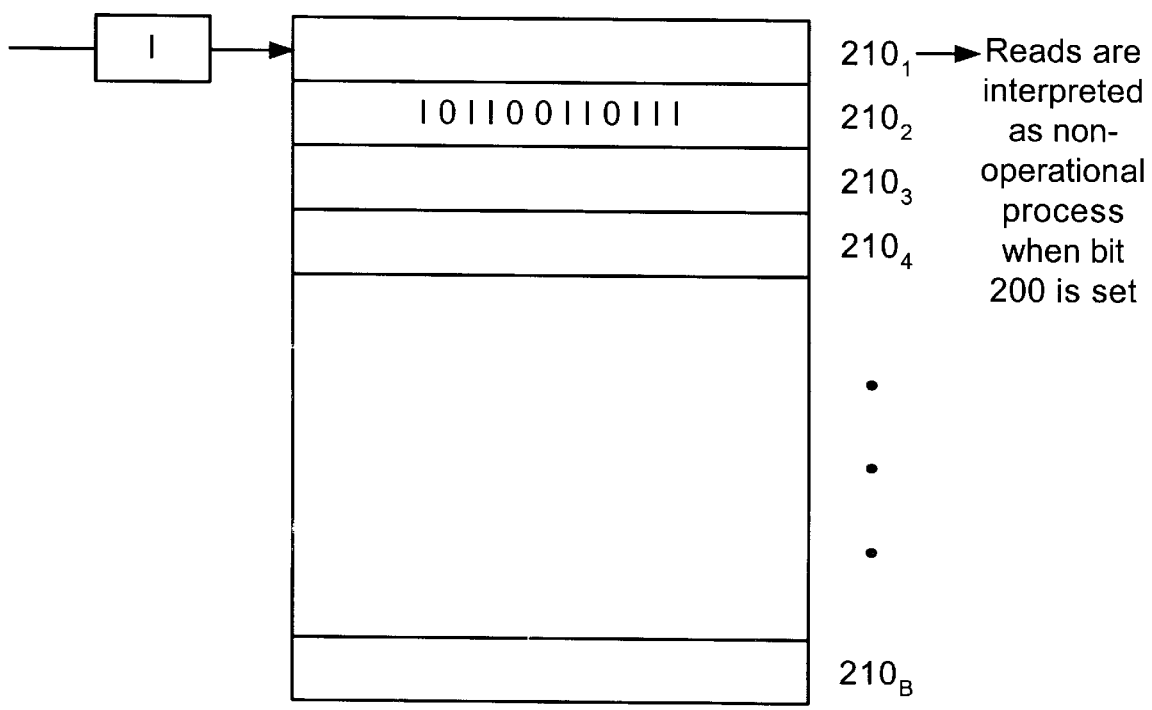
Figure 4C:
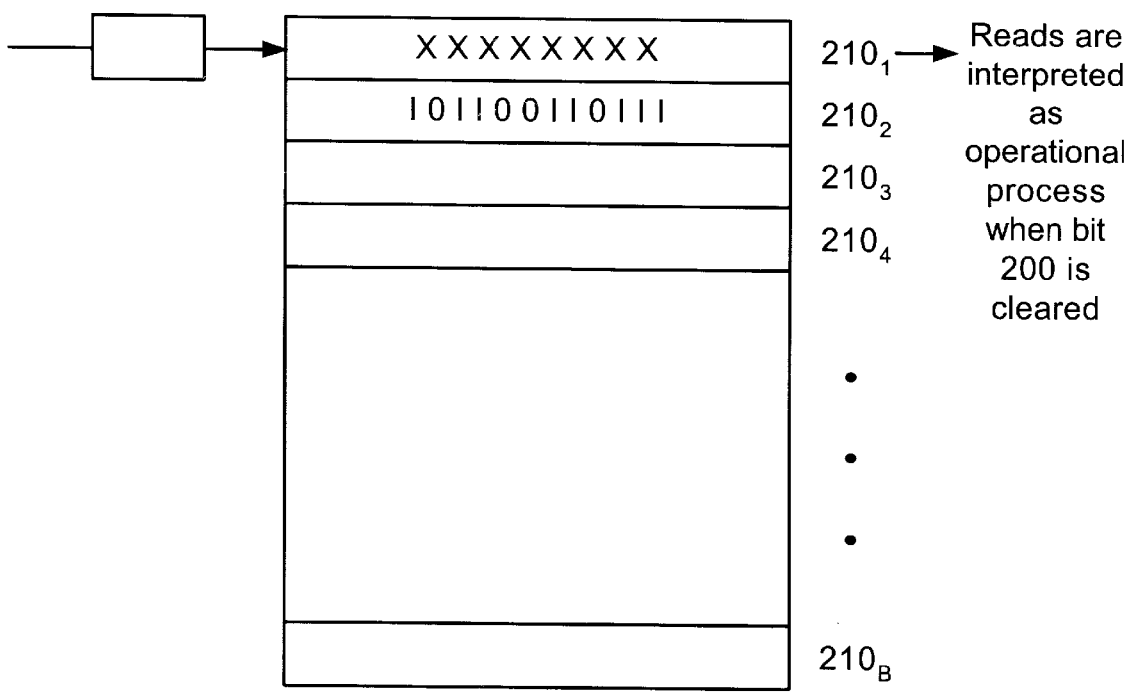

FIGS. 4A–4C illustrate one embodiment of the flash block updating process of the present invention. FIG. 4A illustrates the contents of the block $210_1$ and the contents of the configuration bit 200 prior to implementing the updating process. When applications or processes requiring the updating of the block $210_1$ occurs, the processor 105 issues an instruction to copy the contents of the block $210_1$ to the block $210_2$ immediately below block $210_1$. Next, the configuration bit is set. When the configuration bit 200 is set, all read operations accessing the block $210_1$ are returned as nonoperational (NOP). In one embodiment, when the configuration bit 200 is set, a read operation accessing the block $210_1$ is returned as a 90$h$, which is interpreted as an NOP on a processor such as the Intel Pentium Processor.

Next, the contents of the block $210_1$ are erased (see FIG. 4B). The block $210_1$ is then updated (see FIG. 4C) and the configuration bit is cleared. Upon verifying that the block $210_1$ is appropriately updated, the block $210_2$ may be used for other purposes. It may accordingly be erased.

Figure 5:
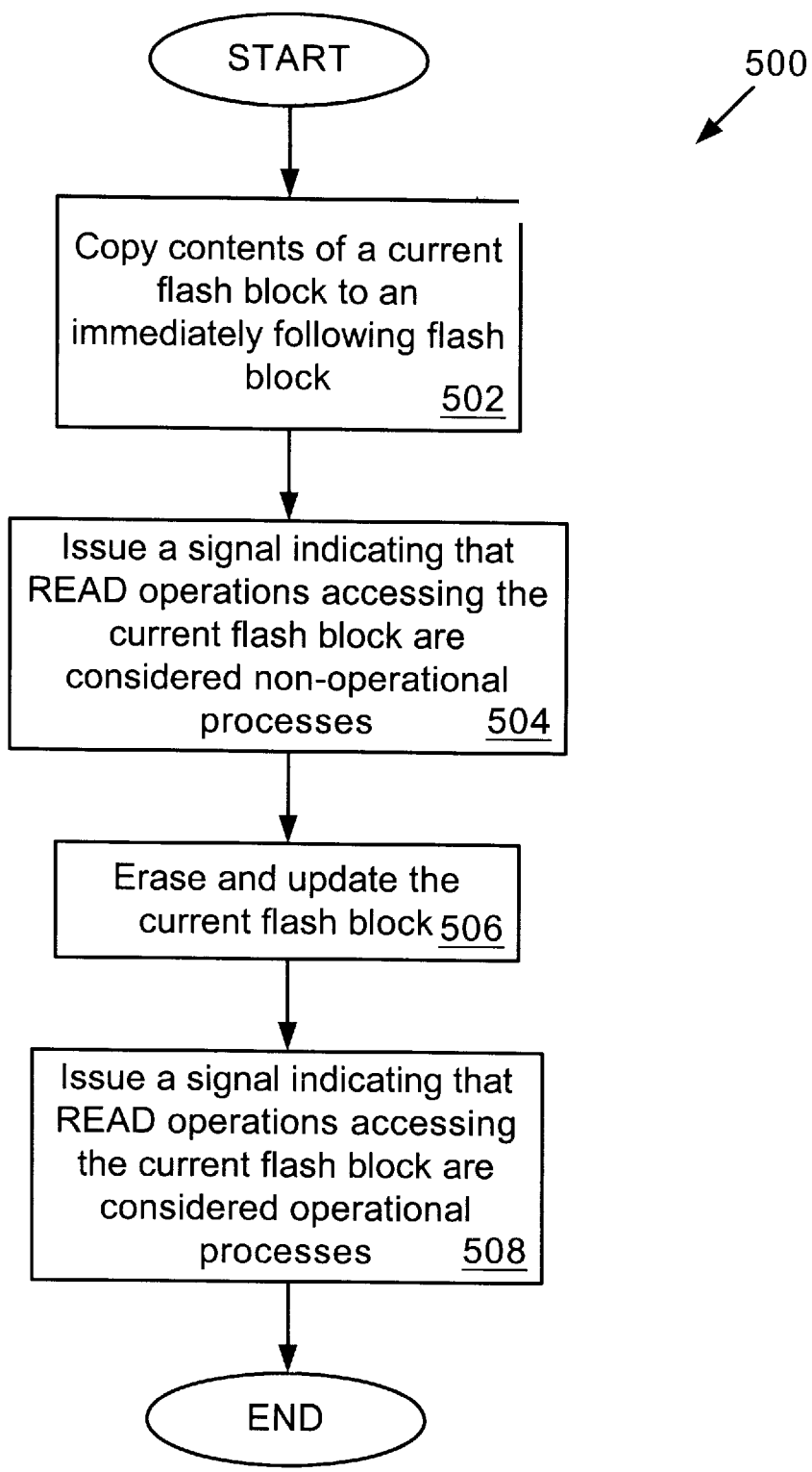
FIG. 5 is a flow chart illustrating one embodiment of the process flow of the invention.

FIG. 5 is a flow chart illustrating one embodiment of the flash block updating process of the invention. Commencing from a start state, the process 500 proceeds to process block 502, here it copies the contents of a current flash block, such as the top block $210_1$, to an immediately following flash block $210_2$. The process 500 then advances to process block 504, where it issues a signal indicating that READ operations attempting to access the current flash block $210_1$ are considered non-operational. In one embodiment, this is implemented by setting the configuration bit 200, which is interpreted by the processor 105 to indicate that READ operations attempting to access the current flash block $210_1$ are considered to be non-operational processes. The process 500 then erases and updates the current flash block $210_1$, as shown in process block 506. Next, the process 500 issues a signal indicating that READ operations attempting to access the current flash block $210_1$ are considered operational processes. In one embodiment, this is implemented by clearing the configuration bit 200. The process 500 then terminates.

Through the use of the present invention, an apparatus and method for updating flash blocks while maintaining data integrity in the event of power failure, is disclosed.

Although the present invention has been described in terms of certain preferred embodiments, other embodiments apparent to those of ordinary skill in the art are also within the scope of this invention.

What is claimed is:

1. A system for updating memory comprising:
   a block-writable memory;
   a processor coupled to said memory, the processor to execute instruction sequences;
   wherein the instruction sequences, when executed, cause the processor to: (a) copy contents of a first storage location in the memory to a second storage location in the memory; (b) update the contents of the first storage location by writing updated contents to the first storage location; (c) issue a signal indicating that a read operation accessing the first storage location is non-operational while the contents of the first storage location are being updated; and (d) issue a signal indicating that a read operation accessing the first storage location is operational after the contents of the first storage location have been updated.

2. The system of claim 1, further comprising a storage element coupled to the processor and the memory, the storage element having a first value indicating that a read operation accessing the first storage location is non-operational, and a second value indicating that a read operation accessing the first storage location is operational.

3. The system of claim 2, wherein in (c), the instruction sequences further cause the processor to assign the first value to the storage element; and wherein in (d), the instruction sequences further cause the processor to assign the second value to the storage element.

4. The system of claim 1, wherein the block-writable memory comprises flash memory.

5. The system of claim 1, wherein the first and second storage locations are adjacent storage locations.

6. A method comprising:
   (a) copying the contents of a first storage location in a memory to a second storage location in the memory;
   (b) updating the contents of the first storage location by writing updated contents to the first storage location;
   (c) issuing a signal indicating that a read operation accessing the first storage location is non-operational while the contents of the first storage location are being updated; and
   (d) issuing a signal indicating that a read operation accessing the first storage location is operational after the contents of the first storage location have been updated.

7. The method of claim 6, wherein (c) further comprises assigning a first value to a storage element indicating that a read operation accessing the first storage location is non-operational; and wherein (d), further comprises assigning a second value to the storage element indicating that a read operation accessing the first storage location is operational.

8. The method of claim 6, wherein in (a), the memory comprises flash memory.

9. The method of claim 8, wherein the first and second storage locations are adjacent storage locations.

10. A computer program product, comprising:
    a computer usable medium having computer program code embodied therein for updating a memory in a processor-based system, the computer program product having:
    (a) computer readable program code for copying the contents of a first storage location in a memory to a second storage location in the memory;
    (b) computer readable program code for updating the contents of the first storage location by writing updated contents to the first storage location;
    (c) computer readable program code for issuing a signal indicating that a read operation accessing the first storage location is non-operational while the contents of the first storage location are being updated; and
    (d) computer readable program code for issuing a signal indicating that a read operation accessing the first storage location is operational after the contents of the first storage location have been updated.

11. The computer program product of claim 10, the computer readable program code in (c) is further for assigning a first value to a storage element indicating that a read operation accessing the first storage location is non-operational; and the computer readable program code in (d) is further for assigning a second value to the storage element indicating that a read operation accessing the first storage location is operational.

12. The computer program product of claim 10, wherein in (a), the memory comprises flash memory.

13. The computer program product of claim 10, wherein the first and second storage locations are adjacent storage locations.

14. The computer program product of claim 13, wherein the first storage location is a top flash memory block.

15. The computer program product of claim 12, wherein the computer program code in (c) is further for updating the contents of the first storage location.

* * * * *